(12) United States Patent
McMillan

(10) Patent No.: US 7,802,901 B2
(45) Date of Patent: Sep. 28, 2010

(54) LED MULTI-CHIP LIGHTING UNITS AND RELATED METHODS

(75) Inventor: Michael McMillan, Sanford, NC (US)

(73) Assignee: CREE, Inc., Durham, NC (US)

( * ) Notice: Subject to any disclaimer, the term of this patent is extended or adjusted under 35 U.S.C. 154(b) by 0 days.

(21) Appl. No.: 11/903,806

(22) Filed: Sep. 25, 2007

(65) Prior Publication Data

US 2009/0080185 A1 Mar. 26, 2009

(51) Int. Cl.
*F21V 21/00* (2006.01)
*F21V 9/00* (2006.01)

(52) U.S. Cl. .................. 362/231; 362/184; 362/249.05; 362/249.06

(58) Field of Classification Search .................. 362/231, 362/184, 249.02, 249.05, 249.12, 295, 249.14, 362/249.06; 315/150, 297, 307
See application file for complete search history.

(56) References Cited

U.S. PATENT DOCUMENTS

| | | | | |
|---|---|---|---|---|
| 4,947,291 | A * | 8/1990 | McDermott | 362/19 |
| 6,357,893 | B1 * | 3/2002 | Belliveau | 362/285 |
| 6,617,795 | B2 * | 9/2003 | Bruning | 315/151 |
| 6,922,269 | B2 * | 7/2005 | Kikuchi | 359/204 |
| 7,009,343 | B2 * | 3/2006 | Lim et al. | 315/150 |
| 7,284,890 | B2 * | 10/2007 | Ahn et al. | 362/612 |
| 7,455,423 | B2 * | 11/2008 | Takenaka, Yasuji | 362/231 |
| 2003/0156425 | A1 * | 8/2003 | Turnbull et al. | 362/545 |
| 2006/0209538 | A1 * | 9/2006 | Chang et al. | 362/231 |

OTHER PUBLICATIONS

Information regarding KROMA™ at least as early as Nov. 22, 2006—www.surefire.com/maxexp/main/co_disp/displ/prrfnbr/24412/sesent/00.
Information regarding the Surefire KROMA™ LED Flashlight at least as early as Nov. 22, 2006—www.lapolicegear.com/sukrledfl.html.
Information on surefire website ar least as early as Jul. 2, 2007—www.surefire.com/maxexp/main/co_disp/displ/pgrfnbr/525/sesent/00.
Information on Blackhawkvideo.com website regarding "Gladius" at least as early as Aug. 13, 2007—www.blackhawkvideo.com/flashlights.html.
Information regarding Night-Ops for "Our First Release is the Gladius" at least as early as Aug. 12, 2007—www.night-ops.com/ledhandheld.html.

(Continued)

*Primary Examiner*—Thomas M Sember
(74) *Attorney, Agent, or Firm*—Jenkins, Wilson, Taylor & Hunt, P.A.

(57) ABSTRACT

Light emitting device multi-chip lighting units and related methods are disclosed. According to one aspect, a white LED chip, a red LED chip, a blue LED chip, and a green LED chip are operably configured to a semiconductor substrate positioned within a lighting unit housing. The lighting unit can therefore provide a white light beam, a red light beam, a green light beam, and a blue light beam. The LED chips can be configured on the substrate such that the emitted light beams can overlap. Thus, in addition to the white LED chip providing a white light beam, the red LED chip, the blue LED chip, and the green LED chip can be actuated simultaneously with the white LED chip to combine and emit a more powerful and intense white light beam. Additionally, the red LED chip, the blue LED chip and the green LED chip can be actuated simultaneously to emit an intermediary intensity white light beam from the lighting unit.

32 Claims, 5 Drawing Sheets

OTHER PUBLICATIONS

Information regarding the KROMA LED and G2 LED at least as early as Aug. 26, 2007—www.surefire.com/maxexp/main/co_disp/displ.

Information reguarding Night-Ops™ at least as early as Aug. 31, 2007—www.night-ops.com/ledhanheld.html.

Information regarding the Gerber Recon LED Flashlight at least as early as Sep. 11, 2007—www.pocketlights.com/gerber_recon.

* cited by examiner

LED MULTI-CHIP LIGHTING UNITS AND RELATED METHODS

TECHNICAL FIELD

The subject matter described herein relates to semiconductor light emitting devices. More particularly, the subject matter described herein relates to multiple light emitting device chips configured to a single substrate that can be housed in a lighting unit and related methods.

BACKGROUND

Semiconductor light emitting devices, such as a light emitting diode (LED), may be provided in a package for protection, color selection, focusing, and the like for light emitted by the device. An LED package generally includes a substrate member on which an LED is mounted. The LED may include a mounting pad attached to the substrate member with electrical connections being made to the LED for applying an electrical bias. LEDs generally comprise an active region of semiconductor material sandwiched between two oppositely doped layers. When a bias is applied across the doped layers, holes and electrons are injected into the active region where they recombine to generate light. Light is emitted omnidirectionally from the active layer and from all surfaces of the LED. The substrate member may also include traces or metal leads for connecting the package to external circuitry and the substrate may also act as a heat sink to conduct heat away from the LED during operation.

An LED package may include a lens positioned for receiving light emitted by an LED in the package. The lens may include optical materials intended to influence or change the nature of the light emitted by the LED. Further, the lens may be suitably shaped for scattering the light and/or otherwise redirecting or influencing the light.

Increasingly, LED packages are finding their way into everyday commercial products such as flashlights, spotlights, safety vehicle lighting, and internal vehicle lighting systems. For various reasons, devices providing a range of light beam colors are sought by military personnel, law enforcement personnel, and hunters. For example, red light can be used on vessels and helicopters at night so as not to disturb night vision of the human eye while still allowing maneuverability. Also, blue light can be used to differentiate and follow certain liquids (e.g., blood, oil, hydraulic fluid, etc.) since particular liquids absorb blue light wavelengths differently. This can be advantageous for hunters tracking animal blood when visibility is limited or automotive technicians seeking the source of an oil leak.

LED packages provide a challenge in effecting the different color beams needed for these various applications. In current lighting units, beam filters are mechanically attached and employed to filter white light for providing the various color beams. The beam filters can be either added to the light in front of a lens as a mechanical attachment or by some other design intent. Typically, as described in U.S. Pat. No. 6,761,467 to Matthews et al., the beam filters operate on a flip-up design that allows a quick transition back to a white light beam. In other aspects, the beam filters operate by rotating the lens in front of the light source, which is offset from the central body axis, to allow selection of multiple beam filters by rotation of the lens.

Additionally, multiple color lamps can be positioned inside lighting units such as flashlights to provide various color beams. These lighting units change colors, however, by activating individual lamps wherein each individual lamp comprises a single chip emitting a single color. This configuration of multiple lamps does not approach the brightness needs or reflector efficiency required for these lighting units. Also, the use of multiple lamps is limited by size constraints of the lighting unit such that the lamps are off-centered, leading to beam shifting. It is therefore desirable to provide improvements in LED lighting units capable of emitting multiple color light beams. Particularly, it would be beneficial to eliminate the use of beam filters and multiple lamps within the lighting unit housing.

Accordingly, there exists a long-felt need for LED multi-chip lighting units and related methods that provide improvements in lighting units employing various color light beams as well as the powering properties afforded by LEDs versus traditional gas filled lighting sources.

SUMMARY

According to the present disclosure, novel LED multi-chip lighting units and related methods are provided for emitting individually selectable colored light beams while also providing a dual-output white light beam.

It is therefore an object of the present disclosure to provide LED multi-chip lighting units and related methods for emitting individually selectable colored light beams without the use of beam filters or individual color lamps.

An object having been stated above, and which is achieved in whole or in part by the subject matter disclosed herein, other objects will become evident as the description proceeds when taken in connection with the accompanying drawings as best described hereinbelow.

BRIEF DESCRIPTION OF THE DRAWINGS

Preferred embodiments of the subject matter described herein will now be explained with reference to the accompanying drawings of which.

DETAILED DESCRIPTION

Figure 1:
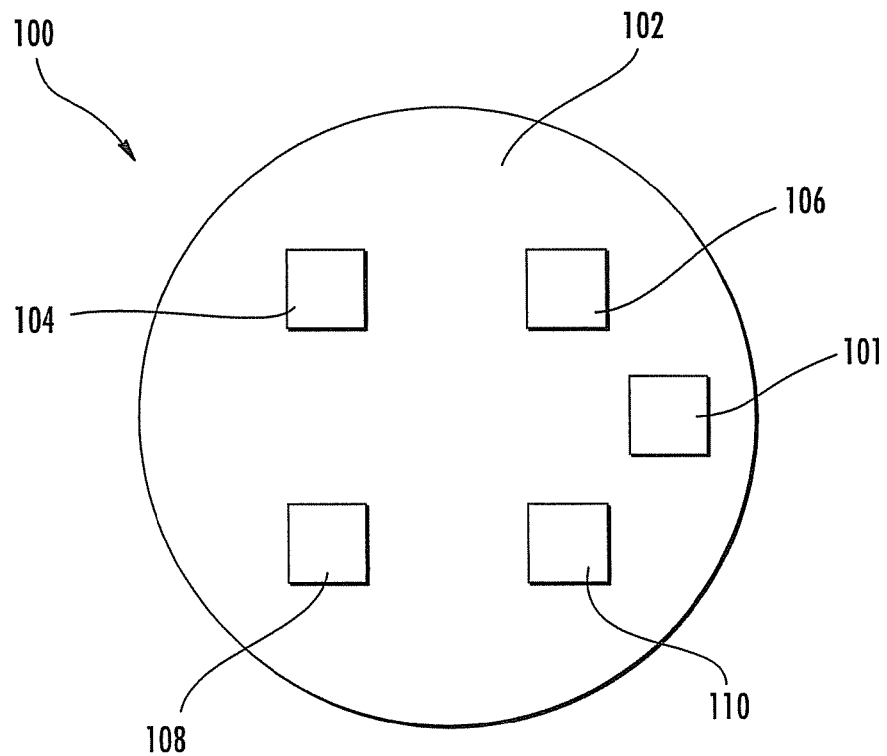
FIG. 1 is a top plan view of a multi-chip lamp source assembly according to an embodiment of the subject matter described herein.

Light emitting device multi-chip lighting units and related methods are described herein with reference to FIGS. 1-4. As illustrated in FIGS. 1-4, some sizes of structures or portions may be exaggerated relative to other structures or portions for illustrative purposes and, thus, are provided to illustrate the general structures of the subject matter disclosed herein. Further, various aspects of the subject matter disclosed herein are described with reference to a structure or a portion being formed on other structures, portions, or both. As will be appreciated by those of skill in the art, references to a structure being formed "on" or "above" another structure or portions contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the Figures. It will be understood that relative terms such as "on" or "above" are intended to encompass different orientations of the device in addition to the orientation depicted in the Figures. For example, if the device in the Figures is turned over, structure or portion described as "above" other structures or portions would now be oriented "below" the other structures or portions. Likewise, if the device in the Figures is rotated along an axis, structure or portion described as "above" other structures or portions would now be oriented "next to" or "left of" the other structures or portions. Like numbers refer to like elements throughout.

According to one aspect of the subject matter disclosed herein, a multi-chip lamp source assembly is provided that can be housed within a lighting unit such as a flashlight. The lighting unit can include the multi-chip lamp source assembly, a power supply source operably configured to the multi-chip lamp source assembly, and a housing that can carry the multi-chip lamp source assembly and the power supply source. The multi-chip lamp source assembly can include a semiconductor substrate adapted for attachment of multiple light emitting device chips. A red LED chip can be attached to the semiconductor substrate and can emit a substantially red light beam. A blue LED chip can be attached to the semiconductor substrate and can emit a substantially blue light beam. A green LED chip can be attached to the semiconductor substrate and can emit a substantially green light beam. A white LED chip can be attached to the semiconductor substrate and can emit a substantially white light beam having a first intensity. In use, the assembly can be housed in lighting fixtures such as, for example, a flashlight to provide various lighting effects for numerous applications.

As used herein, the term "light emitting device" may include an LED, laser diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. The design and fabrication of semiconductor light emitting devices is well known to those having skill in the art and need not be described in detail herein. For example, the semiconductor light emitting device may be gallium nitride-based LEDs or lasers fabricated on a silicon carbide substrate such as those devices manufactured and sold by Cree, Inc. of Durham, N.C., although other light emitting devices from other material systems may also be used.

FIG. 1 is a top plan view of a multi-chip lamp source assembly, generally designated 100, according to an embodiment of the subject matter described herein. Referring to FIG. 1, multi-chip lamp source assembly 100 can include a substrate 102 and a four chip array. The four chip array can comprise a red LED chip 104, a blue LED chip 106, a green LED chip 108, and a white LED chip 110 (collectively, "LED chips"). In other aspects, multiple chips emitting the same color light beam can be positioned on substrate 102 such that more than four chips are used. For example, two red LED chips, two blue LED chips, and two green LED chips can be used in addition to a single white LED chip.

Figure 1A:
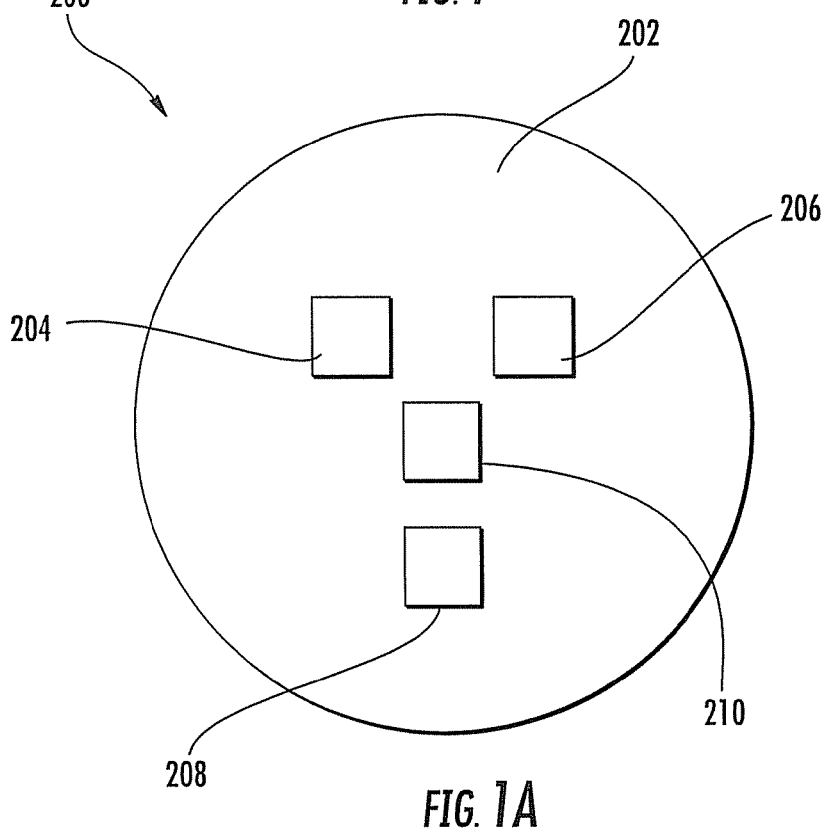
FIG. 1A is a top plan view of an alternative embodiment to FIG. 1.

There can be numerous possible configurations and combinations of chips, provided that there is at least one red, one blue, one green, and one white LED chip. FIG. 1A is a top plan view of a multi-chip lamp source assembly, generally designated 200, comprising substrate 202, red LED chip 204, blue LED chip 206, green LED chip 208, and white LED chip 210.

Multi-chip lamp source assembly 100 can provide a source for an LED lamp and lighting unit such as, for example, a flashlight having multiple powering options. White LED chip 110 can be used to produce a powerful white light beam having a first intensity. LED chips 104, 106, 108, 110 can be activated together to produce a white light beam having a second intensity with a higher luminance than the white light beam produced and emitted by white LED chip 110 individually. Red LED chip 104, blue LED chip 106, and green LED chip 108 can be powered simultaneously to also produce a third intensity of medium luminance white light beam. Thus, a multi-output brightness can be provided, which can give flexibility to a user for selecting brightness. Additionally, red LED chip 104, blue LED chip 106, and green LED chip 108 can each be individually activated by the user to provide its respective colored light beam.

Substrate 102 can be a semiconductor substrate material such as, for example, silicon, copper, silver, FR4, aluminum, thermally conductive polycarbonate, or other suitable material. Substrate 102 may be formed of many different materials, including electrically insulating materials. Suitable substrate materials also can include, but are not limited to, ceramic materials such as aluminum nitride (AlN) and alumina ($Al_2O_3$). Dimensions of substrate 102 can vary widely depending on application and processes used to manufacture multi-chip lamp source assembly 100. For example, in the illustrated embodiment, substrate 102 may have dimensions ranging from fractions of millimeters (mm) to tens of millimeters.

With continuing reference to FIG. 1, LED chips 104, 106, 108, 110 can be operably connected to substrate 102. LED chips 104, 106, 108, 110 can be centered and symmetrically positioned on substrate 102. Proper alignment of LED chips 104, 106, 108, 110 can advantageously prevent shifting of a given light beam emitted from each chip. LED chips 104, 106, 108, 110 can be offset from the center in any symmetrical manner. LED chips 104, 106, 108, 110 can be equidistant angularly and evenly spaced so that the emitted beams overlap.

In this manner, beam filters can be eliminated from the lighting unit and the light source can remain virtually centered on substrate 102 while the user can easily switch between beam colors without add-on hardware. In one particular aspect, LED chips 104, 106, 108, 110 can be offset not more than 0.5 millimeters to eliminate beam shifting such that the emitted light can remain concentric regardless of the chip or chips emitting light. LED chips 104, 106, 108, 110 can be close enough in proximity to create a common beam and wherein the beam does not shift when the color or intensity changes. Also, additional chips can be used for additional lighting in various applications and can also be evenly spaced among the other chips on substrate 102.

Figure 2:
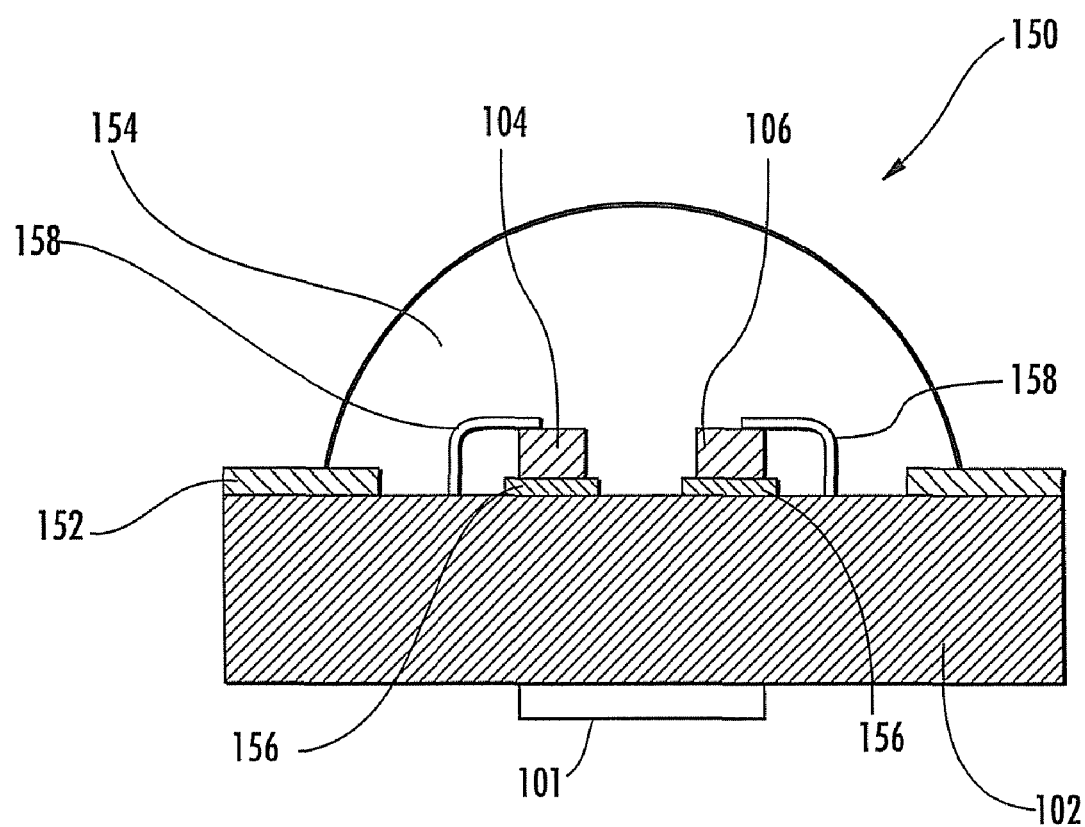
FIG. 2 is a cross-sectional side view of a multi-chip lamp having a substantially flat substrate surface according to the subject matter described herein.
Figure 3:
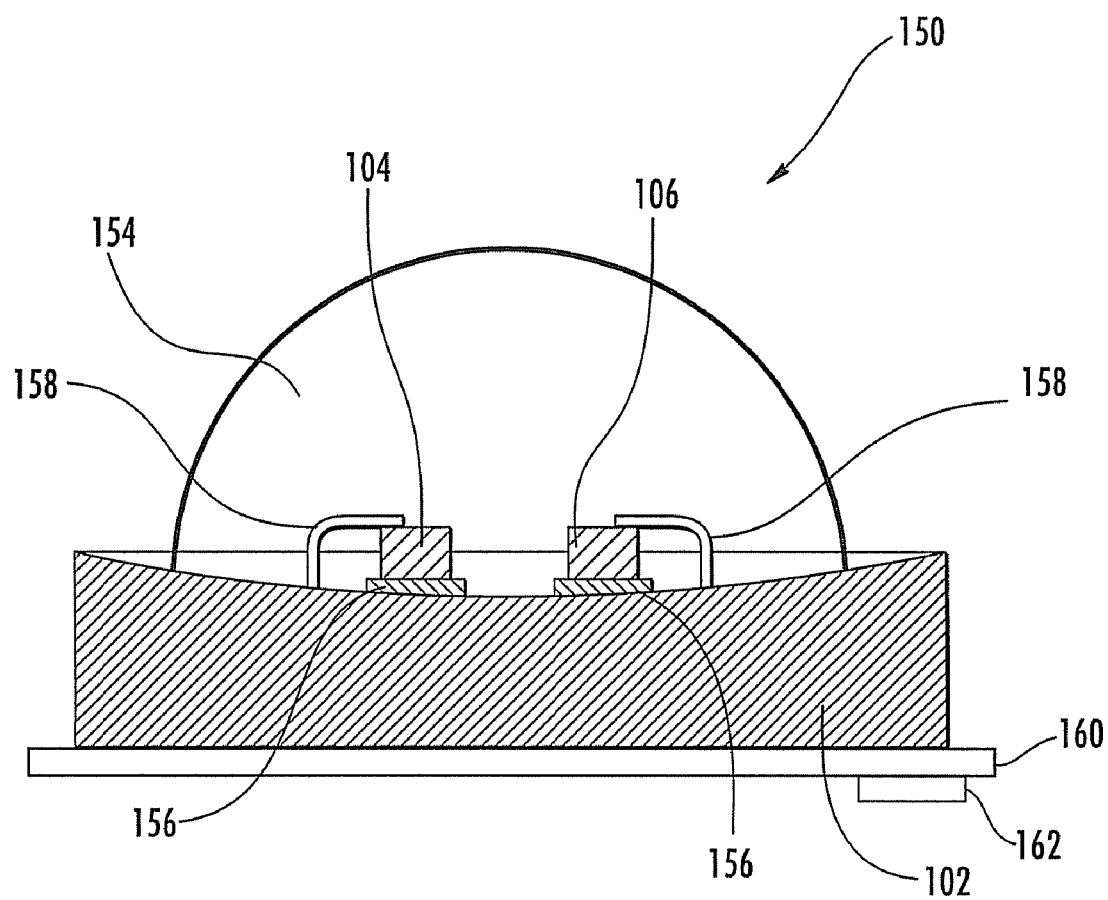
FIG. 3 is a cross-sectional side view of a multi-chip lamp having a concave substrate surface according to the subject matter described herein.

As shown in FIGS. 2 and 3, a multi-chip lamp, generally designated 150, can be formed using multi-chip lamp source assembly 100. A masking layer 152 can be provided on top of substrate 102. A dome lens 154 can be positioned over substrate 102 and LED chips 104, 106, 108 (not shown), 110 (not shown). Dome lens 154 can be constructed of an encapsulant material. The encapsulant material can be any suitable type of resin material such as a silicone or epoxy-based material. The encapsulant material can be cured such that it remains in a form with a convex meniscus. Dome lens 154 can be clear such that LED chips 104, 106, 108, 110 emit their true color light beams.

In other aspects, dome lens 154 can be phosphor shaded or colored such as, for example, a green lens. In one embodiment where dome lens 154 is green, blue LED chip 106 can provide a powerful white light beam and white LED chip 110 can emit a green light beam. These embodiments can be configured in a number of ways to emit a white light beam, red light beam, blue light beam, and green light beam. Thus, for example, a red light beam can be emitted from source assembly 200 with various predetermined combinations of chip colors, encapsulant material colors, or lens colors. The same applies to blue, green, and white light beams.

LED chips 104, 106, 108, 110 can be mounted on mounting pads 156 attached to the top of substrate 102. Mounting pads 156 can be mounted to substrate 102 with electrical connections being made to LED chips 104, 106, 108, 110 for applying an electrical bias. A top surface of each of LED chips 104, 106, 108, 110 can be connected to electrical connections by conductive bond wires 158.

Referring to FIG. 2, the top of substrate 102 can be a simple flat substrate wherein LED chips 104, 106, 108, 110 are placed on the level surface. This configuration can allow for light to potentially be lost out the sides unless a reflective lens surface in the light is used to compensate. Referring to FIG. 3, the top of substrate 102 can be designed to include a curved surface as known in the art. The curvature can allow for more lumens to be directed through dome lens 154 instead of losing a portion of the light through the sides. Additionally, a larger more traditional reflective flash light surface can then be used to further focus the light beam.

Figure 4:
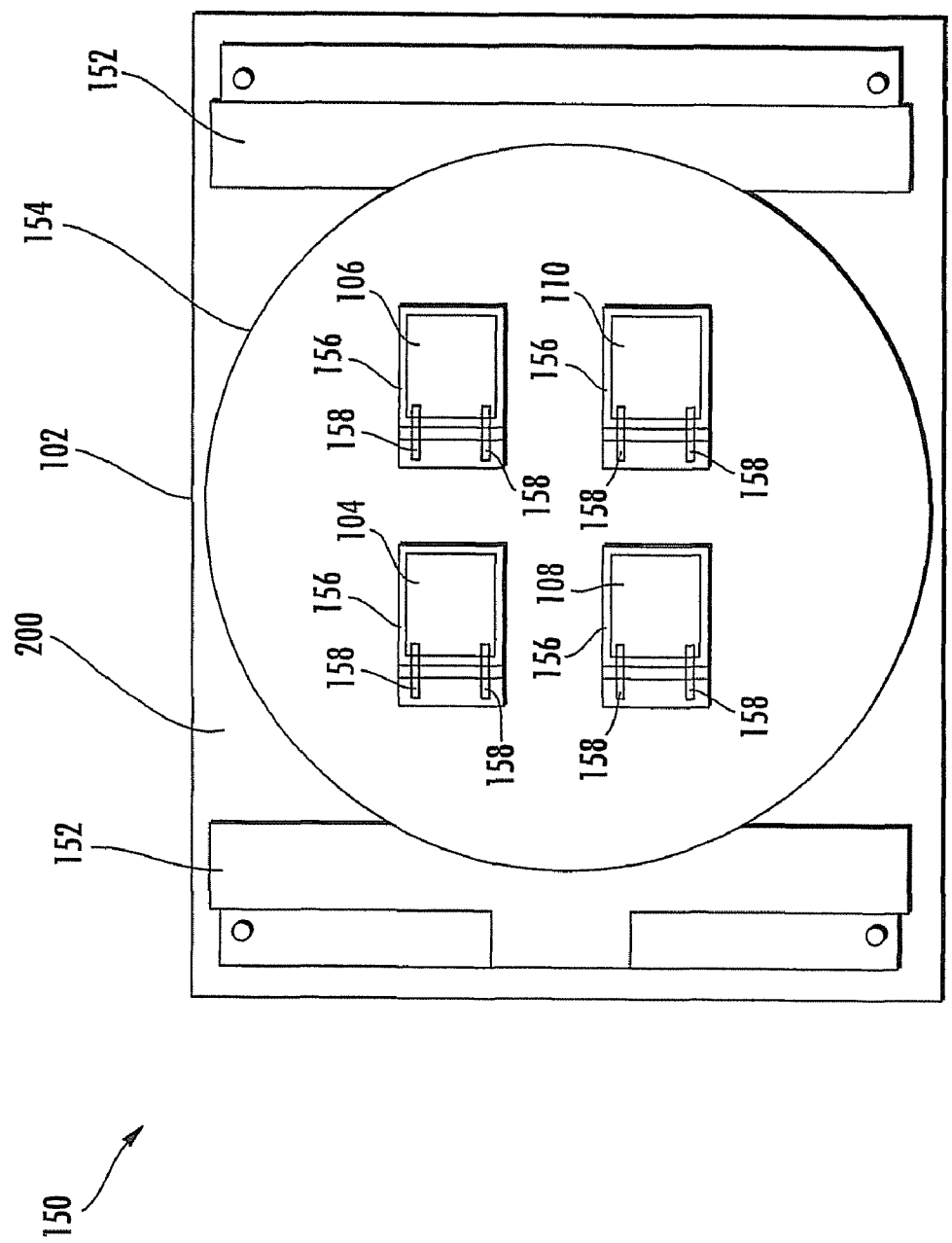
FIG. 4 is a top plan view of a substrate and a red LED chip, a blue LED chip, a green LED chip, and a white LED chip according to the subject matter described herein.

FIG. 4 is a top plan view of substrate 102 and LED chips 104, 106, 108, 110. Referring to FIG. 4, substrate 102 includes a top surface 200 and mounting pads 156. LED chips 104, 106, 108, 110 can be mounted to mounting pad 156. Electrical traces can provide electrical connection to LED chips 104, 106, 108, 110 either through a submount (not shown) or by bond wires 158. Other aspects of LED packaging and structure not shown or described can be employed by those of ordinary skill in the art. These aspects can include, but are not limited to couplers, electrical traces, and conductive portions.

A control chip 101 as shown in FIGS. 1 and 2 can be operably configured to multi-chip lamp source assembly 100 to regulate output for thermal purposes and power consumption. The control chip 101 can be mounted on the substrate front-side or back-side, in a tail section of the lighting unit, or any other suitable location. The control chip 101 can be used to allow individual color selection of LED chips 104, 106, 108, 110 by individually actuating each chip. The control chip 101 can also control the voltage supplied to LED chips 104, 106, 108, 110 for varying the brightness emitted thereby, wherein brightness for each of the colors can be adjustable. Such a dimming function is desirable because white light that is too bright can be extremely intense and create long shadows. Furthermore, the control chip 101 can be used to allow output of both a white light having a first intensity and a more intense white light having a second intensity. Also, the control chip 101 can be used in the lighting unit to allow for types of controls for signaling or general use such as for example a red strobe light, a green strobe light, a blue strobe light, a white strobe light, or a more intense white strobe light.

Figure 5A:
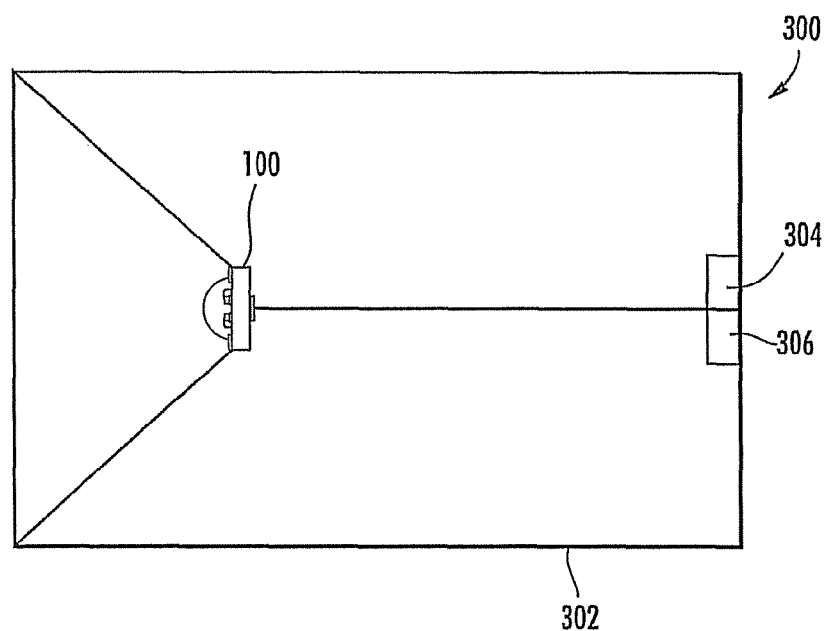
FIG. 5A is a cross-sectional view of a lighting unit using a substrate and a red LED chip, a blue LED chip, a green LED chip, and a white LED chip according to the subject matter described herein.
Figure 5B:
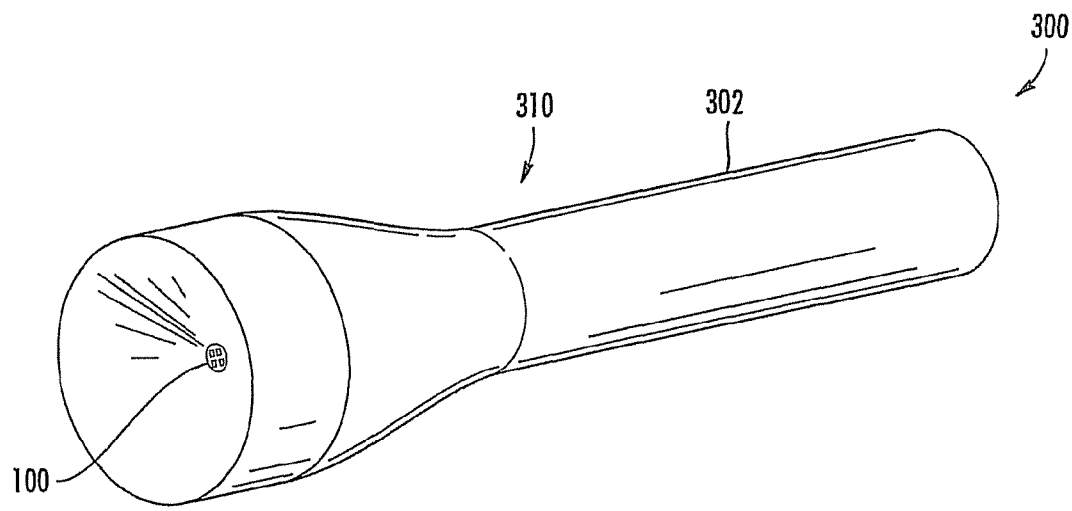
FIG. 5B is a perspective view of a lighting unit using a substrate and a red LED chip, a blue LED chip, a green LED chip, and a white LED chip according to the subject matter described herein.

In use, multi-chip lamp source assembly 100 as shown in FIGS. 1-4 can be configured with circuitry 160 (see FIG. 3), 304 (see FIGS. 5A and 5B) for actuating LED chips 104, 106, 108, 110 individually and sets of chips such that the lighting unit can function in the desired manner without the use of filters or multiple lamps. The circuitry 160, 304 can include a power supply 162 (see FIG. 3), 306 (see FIGS. 5A and 5B) and logic as known to those of skill in the art. Multi-chip lamp source assembly 100 can be used as the light source for an LED lamp that can be housed in a housing 302 of a lighting unit 300 (see FIGS. 5A and 5B) such as for example a flashlight 310 (see FIG. 5B) or a lantern. Positioning LED chips 104, 106, 108, 110 on a single substrate 102 and having a single dome lens 154 can eliminate the need for multiple LED lamps within a lighting unit housing. Such prior configurations are limited by physical constraints on the size of the housing and placement of the LED lamps. Furthermore, these prior configurations position the LED lamps off-center, which can lead to beam shifting when changing beam colors. As such, it is advantageous to position LED chips 104, 106, 108, 110 on a single substrate 102 to provide a single lamp with the features describe herein.

As controlled by the control chip, LED chips 104, 106, 108, 110 can be individually actuated by the user, usually by some mechanical switch or knob attached to the lighting unit. White LED chip 110 can be turned to an ON position such that white LED chip 110 can emit a white light having a first intensity. It is desirable to have multiple intensities, such as a high and low setting, of white light available for use in various circumstances. To that end, LED chips 104, 106, 108, 110 can be activated simultaneously to provide a white light having a second intensity greater than that of the first intensity. The light emitted from red LED chip 104, blue LED chip 106, and green LED chip 108 combine to form the white light that is further combined and added to the light emitted by white LED chip 110 to provide the white light having a second intensity greater than that emitted by white LED chip 110 alone. In this manner, multi-chip lamp source assembly 100 can provide multi-output white light.

As mentioned hereinabove, LED chips 104, 106, 108, 110 can be centered and aligned such that the beams substantially overlap and that when red, blue, and green light beams overlap they provide a white light beam. Thus, in one particular embodiment, the lighting unit can provide a red light beam, a blue light beam, a green light beam, a low intensity white light beam, and a high intensity white light beam. Red LED chip 104, blue LED chip 106, and green LED chip 108 can be actuated simultaneously without white LED chip 110 to provide a white light having a third intensity that has a luminance of medium intensity between the first and second intensities.

The intensities of each of these colored beams can be varied by using the control chip. Additionally, the control chip can be configured to provide a strobe light effect. Such applications for this function can include a blue strobe light for law enforcement to use while on foot or directing traffic, a green strobe light for signaling, a red strobe light for signaling during night operations, and a white low intensity strobe light for day signaling. Also, a medium and high intensity white light beam, as described hereinabove, can be utilized to provide a white strobe light with two additional intensities.

Thus, lighting units configured with multi-chip lamp source assembly 100 can provide various color beams and intensities for use in a lighting unit without the need for filters or multiple lamps to provide multiple color beams. Instead, multi-chip lamp source assembly 100 can employ LED chips 104, 106, 108, 110 on a single substrate and under a single dome lens such that only one LED lamp is needed within the lighting unit to provide the various colored light beams and a multi-output white light beam. Thus, a flashlight having multi-color beams and multi-output white light beams can be achieved by using a single LED lamp having LED chips 104, 106, 108, 110 on a single substrate, rather than providing multiple lamps or beam filters as previously used.

It will be understood that various details of the presently disclosed subject matter may be changed without departing from the scope of the presently disclosed subject matter. Furthermore, the foregoing description is for the purpose of illustration only, and not for the purpose of limitation.

What is claimed is:

1. A portable LED lighting unit for providing a plurality of individually selectable colored beams, the lighting unit comprising:
   a housing;
   a power supply source carried by the housing; and
   a single multi-chip lamp source centered within the housing and operably configured to the power supply source, the multi-chip lamp source comprising:
      a substrate;
      at least one white light emitting diode (LED) chip operably configured to the substrate to emit a substantially white light beam;
      at least one red LED chip operably configured to the substrate to emit a substantially red light beam;
      at least one blue LED chip operably configured to the substrate to emit a substantially blue light beam; and
      at least one green LED chip operably configured to the substrate to emit a substantially green light beam; and
      wherein the at least one white LED chip, the at least one red LED chip, the at least one blue LED chip, and the at least one green LED chip are configured to be actuatable to create multiple colored light beams and the LED chips are positioned on the substrate such that an emitted light beam remains concentric without shifting regardless of the chip or chips emitting the light beam; and
   a lens on the substrate over the at least one white LED chip, the at least one red LED chip, the at least one green LED chip and the at least one blue LED chip to thereby encase each chip within the lens.

2. The portable LED lighting unit of claim 1, wherein the at least one white LED chip, the at least one red LED chip, the at least one blue LED chip and the at least one green LED chip are centered symmetrically on the substrate.

3. The portable LED lighting unit of claim 1, wherein the at least one white LED chip, the at least one red LED chip, the at least one blue LED chip and the at least one green LED chip are configured to be actuated individually and the at least one white LED chip can be individually actuated to provide a substantially white light beam having a first intensity.

4. The portable LED lighting unit of claim 3, wherein the at least one white LED chip is configured to emit light simultaneously with the at least one red LED chip, the at least one blue LED chip and the at least one green LED chip to provide a substantially white light beam having a second intensity.

5. The portable LED lighting unit of claim 4, wherein the second intensity is greater than the first intensity, thereby providing multi-output brightness.

6. The portable LED lighting unit of claim 1, wherein the at least one red LED chip, the at least one blue LED chip and the at least one green LED chip are configured to emit light simultaneously that overlaps to provide a substantially white light beam having a third intensity.

7. The portable LED lighting unit of claim 1, further comprising a control chip operably configured to the substrate, the at least one white LED chip, the at least one red LED chip, the at least one blue LED chip and the at least one green LED chip.

8. The portable LED lighting unit of claim 7, wherein the control chip is configured to regulate thermal output and power consumption.

9. The portable LED lighting unit of claim 7, wherein the control chip is configured to control the intensity of the light emitted by the at least one white LED chip, the at least one red LED chip, the at least one blue LED chip and the at least one green LED chip.

10. The portable LED lighting unit of claim 7, wherein the portable LED lighting unit comprises a flashlight.

11. A portable LED lighting unit for providing a plurality of individually selectable colored beams without the use of filters, the lighting unit comprising:
    a housing;
    a power supply source attached to the housing; and
    a single multi-chip lamp source centered within the housing and operably configured to the power source, the multi-chip lamp source comprising:
       a substrate having a first side;
       at least one white light emitting diode (LED) chip operably configured to the first side of the substrate to provide a substantially white light beam;
       at least one red LED chip operably configured to the first side of the substrate to emit a substantially red light beam;
       at least one blue LED chip operably configured to the first side of the substrate to emit a substantially blue light beam;
       at least one green LED chip operably configured to the first side of the substrate to emit a substantially green light beam; and
       a lens positioned over the first side of the substrate and the lens positioned above the at least one white LED chip, the at least one red LED chip, the at least one blue LED chip and the at least one green LED chip to thereby encase each chip therewithin; and
       wherein the at least one white LED chip, the at least one red LED chip, the at least one blue LED chip, and the at least one green LED chip are configured to be actuatable to create multiple colored light beams and the LED chips are positioned on the substrate such that an emitted light beam remains concentric without shifting regardless of the chip or chips emitting the light beam.

12. The portable LED lighting unit of claim 11, wherein the at least one white LED chip, the at least one red LED chip, the at least one blue LED chip and the at least one green LED chip are configured to be actuated individually and said at least one white LED chip can be individually actuated to provide a substantially white light beam having a first intensity.

13. The portable LED lighting unit of claim 12, wherein the at least one white LED chip is configured to emit light simultaneously with the at least one red LED chip, the at least one blue LED chip and the at least one green LED chip to provide a white light beam having a second intensity.

14. The portable LED lighting unit of claim 13, wherein the second intensity is greater than the first intensity, thereby providing multi-output brightness.

15. The portable LED lighting unit of claim 11, wherein the at least one red LED chip, the at least one blue LED chip and the at least one green LED chip are configured to emit light simultaneously that overlaps to provide a white light beam having a third intensity.

16. The portable LED lighting unit of claim 11, wherein the portable LED lighting unit comprises a flashlight.

17. The portable LED lighting unit of claim 16, wherein a control chip is used to control the actuation of individual chips and sets of chips.

18. The portable LED lighting unit of claim 11, further comprising a control chip operably configured to the substrate, the at least one white LED chip, the at least one red LED chip, the at least one blue LED chip and the at least one green LED chip.

19. The portable LED lighting unit of claim 18, wherein the control chip is configured to regulate thermal output and power consumption.

20. The portable LED lighting unit of claim 18, wherein the control chip is configured to control the intensity of the light emitted by the at least one white LED chip, the at least one red LED chip, the at least one blue LED chip and the at least one green LED chip.

21. The portable LED lighting unit of claim 18, wherein the portable LED lighting unit comprises a flashlight.

22. A method of forming a portable LED lighting unit for providing a plurality of individually selectable colored beams without the use of filters, the method comprising:
providing a housing;
providing a power supply source that is carried by the housing; and
configuring a single multi-chip lamp source to be centered within the housing and operably connected to the power source, the multi-chip lamp source comprising:
a substrate;
at least one white light emitting diode (LED) chip configured to the substrate such that the at least one white LED chip is configured to emit a substantially white light;
at least one red LED chip configured to the substrate, the at least one red LED chip configured to emit a substantially red light beam;
at least one blue LED chip configured to the substrate, the at least one blue LED chip configured to emit a substantially blue light beam; and
at least one green LED chip configured to the substrate, the at least one green LED chip configured to emit a substantially green light beam;
a lens on the substrate over the at least one white LED chip, the at least one red LED chip, the at least one green LED chip and the at least one blue LED chip to thereby encase each chip within the lens; and
wherein the at least one white LED chip, the at least one red LED chip, the at least one blue LED chip, and the at least one green LED chip are configured to be actuatable to create multiple colored light beams and the LED chips are positioned on the substrate such that an emitted light beam remains concentric without shifting regardless of the chip or chips emitting the light beam.

23. The method of claim 22, wherein the at least one white LED chip, the at least one red LED chip, the at least one blue LED chip and the at least one green LED chip are attached in a centered and symmetrical configuration on the substrate.

24. The method of claim 22, further comprising the step of attaching a control chip to the substrate for regulating thermal output and power consumption.

25. The method of claim 22, further comprising the step of operably configuring a control chip to the at least one white LED chip, the at least one red LED chip, the at least one blue LED chip and the at least one green LED chip for actuating individual chips and sets of chips in order to selectively provide one of a substantially red light beam, a substantially blue light beam, a substantially green light beam, a first intensity white light beam, a second intensity white light beam, and a third intensity white light beam.

26. A portable LED lighting unit for providing a plurality of individually selectable colored beams, the lighting unit comprising:
a housing;
a power supply source carried by the housing; and
a single multi-chip lamp source centered within the housing and operably configured to the power supply source, the multi-chip lamp source comprising:
a substrate having a center;
at least one white light emitting diode (LED) chip operably configured to the substrate to emit a substantially white light beam;
at least one red LED chip operably configured to the substrate to emit a substantially red light beam;
at least one blue LED chip operably configured to the substrate to emit a substantially blue light beam; and
at least one green LED chip operably configured to the substrate to emit a substantially green light beam;
a lens on the substrate over the at least one white LED chip, the at least one red LED chip, the at least one green LED chip and the at least one blue LED chip to thereby encase each chip within the lens; and
wherein the at least one red LED chip, the at least one blue LED chip, and the at least one green LED chip are configured to be equidistant from the center of the substrate.

27. The portable LED lighting unit of claim 26, wherein the at least one white LED chip, the at least one red LED chip, the at least one blue LED chip, and the at least one green LED chip are configured in a centered and symmetrical configuration on the substrate.

28. A portable handheld LED lighting device comprising:
a housing configured to be portable and to be sized to permit a user to carry the device in the hand of the user;
a power supply source carried by the housing; and
a single multi-chip lamp source centered within the housing and operably configured to the power supply source, the multi-chip lamp source comprising:
a substrate;
at least three light emitting diode (LED) chips operably configured to the substrate to form a single LED package, the LED chips comprising at least three different colored LED chips, and being configured to be actuatable either individually or together to provide selectable colored light beams and the LED chips being positioned on the substrate such that an emitted light beam remains concentric without shifting regardless of the chip or chips emitting the light beam; and
a lens on the substrate over the at least three LED chips to thereby encase each chip within the lens.

29. The portable handheld LED lighting device of claim 28, wherein the at least three LED chips are selected from a group consisting of a white LED chip, a red LED chip, a blue LED chip and a green LED chip.

30. The portable handheld LED lighting device of claim 29, wherein the at least three LED chips comprise at least one white LED chip, at least one red LED chip, at least one blue LED chip and at least one green LED chip configured in a centered and symmetrical configuration the substrate.

31. The portable handheld LED lighting device of claim 28, wherein the at least three LED chips are configured to be actuatable to create at least two white light beams of different intensities.

32. The portable LED lighting unit of claim 26, wherein the at least one white LED chip, the at least one red LED chip, the at least one blue LED chip, and the at least one green LED chip are positioned on the substrate such that an emitted light beam remains concentric without shifting regardless of the chip or chips emitting the light beam.

* * * * *